United States Patent [19]

Tanaka et al.

[11] Patent Number: 5,164,850
[45] Date of Patent: Nov. 17, 1992

[54] LIQUID CRYSTAL DEVICE INCLUDING TANTALUM NITRIDE WITH SPECIFIC NITRIDING RATIO

[75] Inventors: Toshihiko Tanaka; Naoto Fukuta; Shouji Nakanishi; Hiroshi Inamura; Takao Yamauchi, all of Tottori, Japan

[73] Assignees: Sanyo Electric Co., Ltd., Osakaofu; Tottori Sanyo Electric Co., Ltd., Tottori, Japan

[21] Appl. No.: 645,022

[22] Filed: Jan. 23, 1991

[30] Foreign Application Priority Data

Jan. 29, 1990 [JP] Japan ............... 2-18649
Sep. 6, 1990 [JP] Japan ............... 2-238138

[51] Int. Cl.$^5$ ........................... G02F 1/1343
[52] U.S. Cl. ........................... 359/58; 359/87
[58] Field of Search ........... 350/333, 334, 332, 339 R; 359/54, 58, 79, 88, 87

[56] References Cited

U.S. PATENT DOCUMENTS

| 4,233,603 | 11/1980 | Castleberry | 340/783 |
| 4,413,883 | 11/1983 | Baraff et al. | 350/334 |
| 4,523,811 | 6/1985 | Ota | 350/333 |
| 4,534,623 | 8/1985 | Araki | 350/339 R |
| 4,586,789 | 5/1986 | Kishimoto et al. | 359/88 |
| 4,767,189 | 8/1988 | Hayashi et al. | 359/88 |
| 4,917,466 | 4/1990 | Nakamura et al. | 359/88 |

FOREIGN PATENT DOCUMENTS 61-232689  3/1987  Japan .
63-126264  5/1988  Japan .
2091468    7/1982  United Kingdom .

OTHER PUBLICATIONS

Baraff et al., "A 68 line Multiplexed Liquid Crystal Display Using MIM Devices", IEEE Conference: Int'l Electronic Devices Meeting (Dec. 8-10, 1980), pp. 707-710.

Baraff et al., "The Optimization of MIM Non-Linear Devices for Use in Multiplexed Liquid Crystal Displays" vol. ed-28, No. 6, Jun. 1981, pp. 736-739.

1980 Sid International Symposium, Digest of Technical Papers, vol. IX, Apr. 1980, pp. 200-201 D. R. Barraff et al, Application of Metal Insulator Metal Non—Linear Devices and Multiplexed Liquid Crystal Display.

Primary Examiner—Janice A. Howell
Assistant Examiner—Ron Trice
Attorney, Agent, or Firm—Darby & Darby

[57] ABSTRACT

A metal-insulator-metal substrate for a liquid crystal display device including an insulating substrate; a first conductor layer of tantalum nitride formed on a region of the insulating substrate; an insulator layer formed to cover at least a portion of the first conductor layer; a second conductor layer formed to cover at least a portion of the insulator layer; and a pixel element formed on another region of the insulating substrate and connected to the second conductor layer, one of the conductor layers having a nitriding ratio in the range of 0.05 to 0.14 or being formed of sublayers having different nitriding ratios.

11 Claims, 4 Drawing Sheets

LIQUID CRYSTAL DEVICE INCLUDING TANTALUM NITRIDE WITH SPECIFIC NITRIDING RATIO

BACKGROUND OF THE INVENTION

1. Field of the Invention

The present invention relates to substrates for liquid crystal display devices and particularly to an improvement of signal lines and nonlinear elements formed on insulating substrates.

2. Description of the Background Art

So-called active type liquid crystal display devices provided with transistors or diodes corresponding to respective pixel electrodes for high multiplexing drive of liquid crystal elements arranged in a matrix are presently manufactured. MIM (metal-insulator-metal) type nonlinear elements which can be manufactured relatively easily are often used as elements for such pixel electrodes.

FIG. 1 is a schematic sectional view of a liquid crystal display device including MIM elements, and FIG. 2 is a plan view showing a part of the lower substrate of the liquid crystal display device of FIG. 1. Referring to those figures, a first conductor pattern 12 serving as signal lines 12a, pixel electrodes 15, and a second conductor pattern 14 connecting the first conductor pattern 12 and the pixel electrodes 15 are formed on the first insulating substrate 11 of glass or the like. A scanning electrode 17 is provided on the lower surface of a transparent second insulating substrate 16, and a liquid crystal layer 19 is enclosed between the first and second substrates 11 and 16 spaced by spacers 18.

An MIM element has a laminated structure including a first metal layer, an insulator layer, and a second metal layer, and as can be seen from FIGS. 1 and 2, a portion 12b of the signal line 12a is usually used as the first metal layer. A thin oxide film (not shown) formed on the surface of the first metal layer 12b is used as the insulator layer. The second conductor pattern 14 covering the insulator layer and connected to the corresponding pixel electrode 15 is used as the second metal layer. In this case, the signal lines 12a, 12b are often formed by tantalum because of easy patterning, good adherence of anodized films formed as the insulator layers, or the like.

However, native oxide films are liable to be formed on the surfaces of the signal lines 12a of tantalum, which causes unfavorable increase of electric resistance values in connections with external circuits.

If the liquid crystal elements are to be activated in order to enhance the contrast of the liquid crystal display device, it is desirable to flow sufficient ON current in the MIM elements. If the liquid crystal elements are to be inactivated, it is desirable to limit OFF current to as small a value as possible. However, if an anodized tantalum oxide ($TaO_x$) film is to be used as the insulator layer of the MIM element, it is not possible to sufficiently reduce the OFF current in the MIM element and it is difficult to obtain a satisfactory contrast value for the liquid crystal display device.

SUMMARY OF THE INVENTION

In view of the above-described prior art, an object of the present invention is to provide substrates for a liquid crystal display device including signal lines having good resistance to oxidation.

Another object of the present invention is to provide substrates for a liquid crystal display device including MIM elements making it possible to flow a sufficient ON current for activation of liquid crystal elements and to reduce OFF current sufficiently for inactivation of the liquid crystal elements.

According to an aspect of the present invention, a substrate for a liquid crystal display device includes: an insulating substrate; a first conductor layer of tantalum nitride formed on a region of the insulating substrate; an insulator layer formed to cover at least a portion of the first conductor layer; a second conductor layer formed to cover at least a portion of the insulator layer; and a pixel element formed on another region of the insulating substrate and connected to the second conductor layer.

According to another aspect of the present invention, a substrate for a liquid crystal display device includes: an insulating substrate; a first conductor layer of tantalum nitride formed on a region of the insulating substrate and having a nitriding ratio in the range of 0.05 to 0.14; an insulator layer formed to cover at least a portion of the first conductor layer; a second conductor layer formed to cover at least a portion of the insulator layer; and a pixel electrode formed on another region of the insulating substrate and connected to the second conductor layer.

According to a further aspect of the present invention, a substrate for a liquid crystal display device includes: an insulating substrate; a first conductor layer of tantalum nitride including a lower first sub layer and an upper second sub layer formed on a region of the insulating substrate and having different nitriding ratios; an insulator layer formed to cover at least a portion of the first conductor layer; a second conductor layer formed to cover at least a portion of the insulator layer; and a pixel electrode formed on another region of the insulating substrate and connected to the second conductor layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
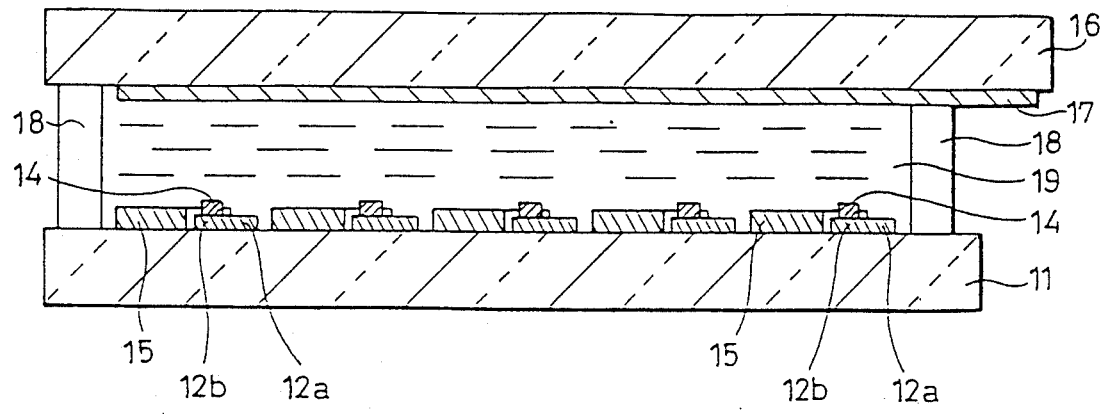
FIG. 1 is a schematic sectional view of a liquid crystal display device in the prior art.
Figure 2:
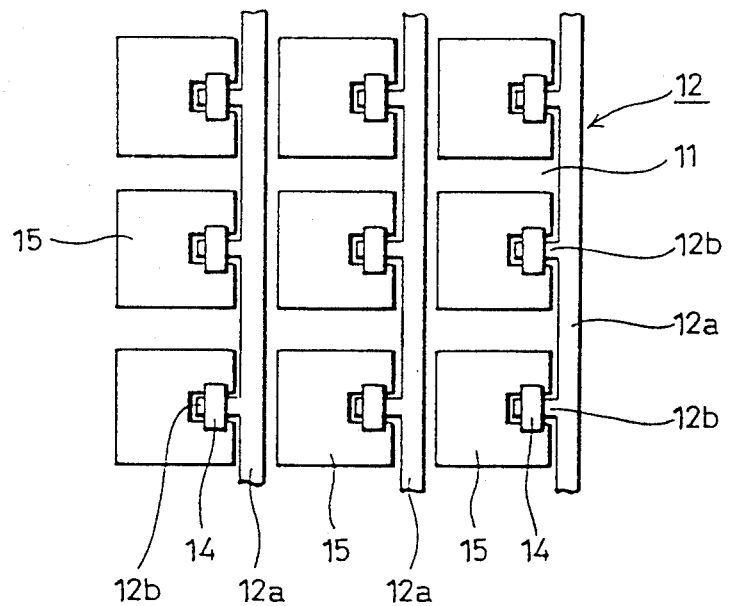
FIG. 2 is a plan view of a part of a substrate for a liquid crystal display device in the prior art.
Figure 3:
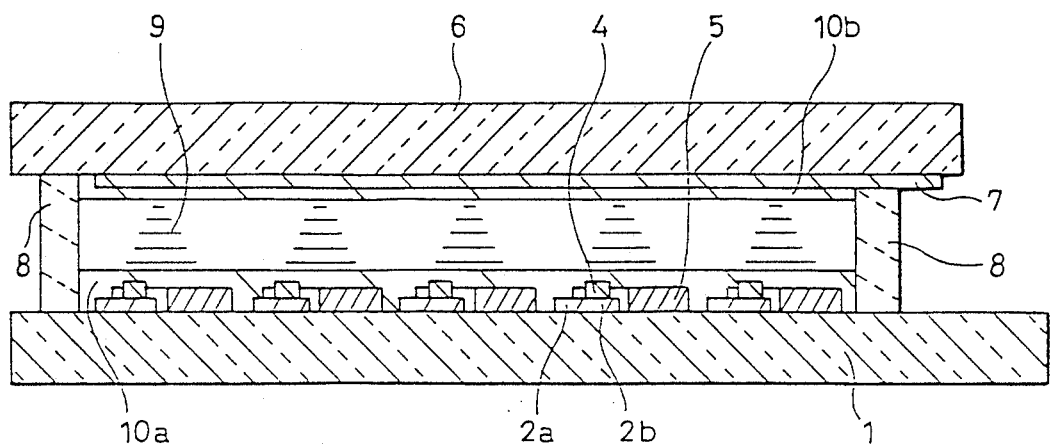
FIG. 3 is a sectional view showing an example of a liquid crystal display device according to the present invention.
Figure 4:
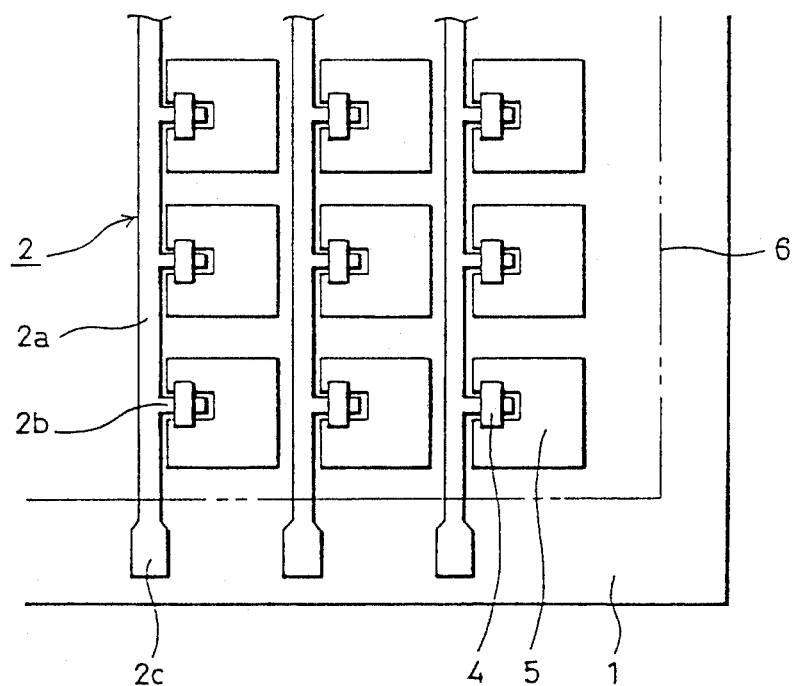
FIG. 4 is a plan view of a part of a substrate for use in the liquid crystal display device of FIG. 3.

Referring to FIGS. 3 and 4, a general structure of a liquid crystal display device according to the present invention will be described. A first conductor pattern 2 serving as signal lines 2a, pixel electrodes 5, and a second conductor pattern 4 connecting the first conductor pattern 2 and the pixel electrodes 5 are formed on a first insulating substrate 1. Those first and second conductor patterns 2, 4 and pixel electrodes 5 are covered with a first orienting film 10a for orienting liquid crystal molecules of a liquid crystal layer 9. A scanning electrode 7 is provided on the lower surface of a transparent second insulating substrate 6, and the scanning electrode 7 is covered with a second orienting film 10b. A liquid crystal layer 9 is enclosed between the first and second substrates 1 and 6 spaced by sealants 8. Each of polarized films (not shown) may be provided on an outer surface of the insulating substrate 1 or 6.

Each signal line 2a includes projecting portions 2b used as first metal layers in MIM elements, and is connected to a terminal portion 2c used for connection with an external circuit.

Figure 5:
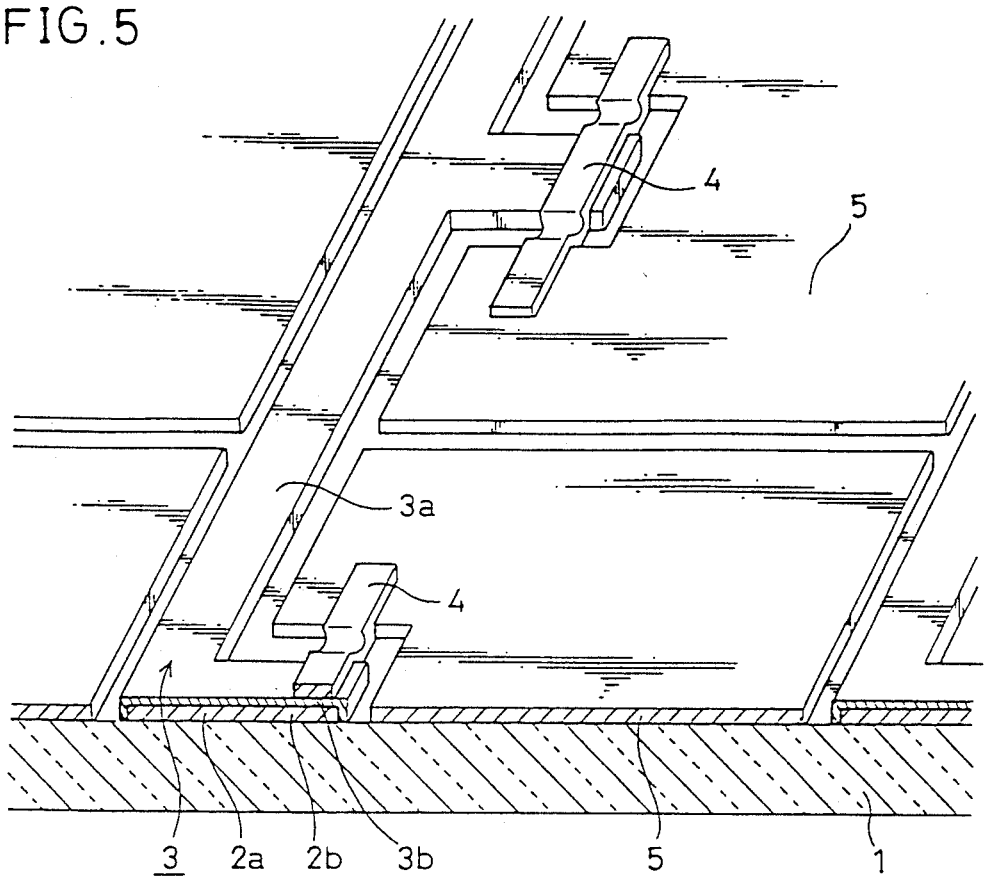
FIG. 5 is a partial fragmentary perspective view of a part of a substrate for a liquid crystal display device according to a first embodiment of the present invention.

Referring to FIG. 5, a portion of a substrate for a liquid crystal display device according to a first embodiment of the present invention is shown as a partial fragmentary perspective view. A glass plate, a surface-treated plastic plate, a metal plate coated with an insulating film, a ceramic plate or the like can be used as the insulating substrate 1.

A signal line 2a of tantalum nitride ($TaN_y$) is formed on the insulating substrate 1 and the surface of the signal line 2a is covered with an anodized film ($TaO_xN_y$) 3. The signal line 2a includes a projecting portion 2b serving as a first metal layer of an MIM element, and a portion 3b of the $TaO_xN_y$ film 3 covering the projecting portion 2b serves as an insulator layer of the MIM element. A second metal layer 4 is laminated on the insulator layer 3b of the MIM element, and the second metal layer 4 is connected to the corresponding pixel electrode 5 formed on the insulating substrate 1. The pixel electrodes 5 may be formed as transparent electrodes of indium oxide or tin oxide.

The first conductor pattern 2 of tantalum nitride may be formed by patterning a tantalum nitride film deposited on the insulating substrate 1 to a thickness of about 1000 to 10,000 Å by sputtering. First, a vacuum chamber where the insulating substrate 1 is set is evacuated to about $10^{-4}$ pascals. After that, while nitrogen gas as well as rare gas such as argon is introduced into the chamber to 1 to 3 pascals, sputtering of tantalum is carried out, whereby a tantalum nitride film can be deposited on the insulating substrate 1. The pure tantalum film formed on the substrate will be oxidized in the air with the substrate temperature or the atmosphere temperature of about 200° C., but the tantalum nitride film will not be naturally oxidized even if it is taken out from the vacuum chamber.

However, if the content of nitrogen is increased, it would be difficult to pattern the tantalum nitride film by dry etching and the sheet resistance value of the tantalum nitride film would be increased. Thus, such increase of the nitrogen content is not favorable. Therefore, a nitriding ratio (y value) as a ratio of the number of nitrogen atoms to the number of tantalum atoms is preferably in the range of 0.05 to 0.14 so that the resistance value of the first metal layer 2b of the MIM element is 10$\phi$/□ or less and so that a desired $TaO_xN_y$ layer 3b is formed.

The tantalum nitride signal lines 2a are patterned so that each signal line 2a has a width in the range of 3 to 50 μm and that the projecting portion 2b of each signal line 2a has a width in the range of 3 to 10 μm. If the signal lines 2a have a large width, the resistance value will be lowered, but the signal lines 2a having a too large width are not desirable because such signal lines 2a will reduce an opening ratio (i.e., a ratio of an area of a pixel electrode occupied in the area per pixel). On the other hand, each projecting portion 2b has preferably a width of 3 μm or more in order to avoid unevenness of electric characteristics due to irregularity of sizes of MIM elements.

At least the surfaces of the projecting portions 2b of the patterned signal lines 2a are anodized by using citric acid solution of 0.01 wt. % for example, whereby insulator layers 3b of $TaO_xN_y$ films of 480 to 800 Å in thickness are formed thereon. The electric characteristics of the MIM elements are substantially defined by the formed insulator layers 3b. If the thickness of the insulator layer 3b is 480 Å or less, such thickness is unfavorable because the OFF current of the MIM elements increases. Conversely, if the thickness of the insulator film 3b is 800 Å or more, such thickness is not favorable because the ON current of the MIM elements is too small. The second metal layer 4 of chromium or aluminum is formed to have a thickness of 100 to 2000 Å and a width of 5 to 7 μm on the insulator layer 3b of each MIM element.

In the substrate for the liquid crystal display device according to the first embodiment as described above, the signal lines are formed of tantalum nitride. Thus, there is no fear of native oxidation of the signal lines 2a and there is no increase in resistance in each connection region 2c with the external circuit. In addition, since the signal lines 2a are covered with the insulator layers 3 except for the connection regions 2c, they are more stable in the liquid crystal display device.

Figure 6:
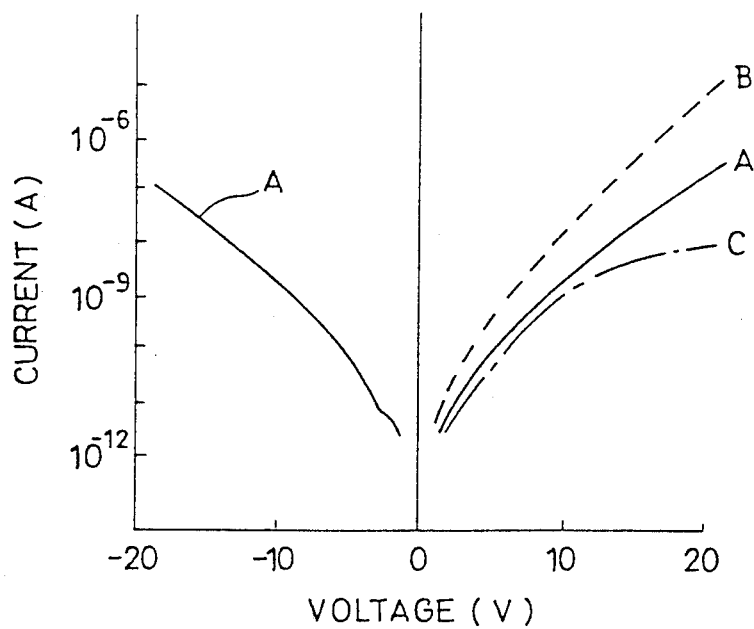
FIG. 6 is a graph showing electric characteristics of an MIM element in the first embodiment.

Referring to FIG. 6, the solid line curves A represent an example of the electric characteristics of an MIM element in the case of using the substrate of the first embodiment for a twist nematic type liquid crystal display device. In this graph, the abscissa represents voltage (V) applied to the MIM element, and the ordinate represents current (A) flowing in the MIM element on a logarithmic scale. As is understood from FIG. 3, a very small current flowing in the MIM element also passes through the twist nematic liquid crystal element.

In the curves A representing the MIM element according to the first embodiment, ON current of about $1 \times 10^{-7}$ A flows with respect to the applied voltage of 18 V, and OFF current of about $2 \times 10^{-10}$ A flows with respect to the applied voltage of 6 V. For comparison, a broken-line curve B represents electric characteristics of an MIM element of the prior art including a first metal layer of tantalum and an insulator layer of an anodized film $TaO_x$. According to the curve B, a larger ON current can be obtained, but it is not possible to sufficiently decrease OFF current. In order to improve the contrast of the liquid crystal display panel, it is effective to reduce OFF current to a smaller value, rather than to increase ON current. If the current value is too large, the operation margin of the liquid crystal device would be reduced.

A chained-line curve C represents electric characteristics of an MIM element including a first metal layer of tantalum nitride having a nitriding ratio of y=0.25 and an insulator layer of $TaO_xN_y$ formed thereon. As can be seen from this curve C, OFF current becomes smaller according to the increase of the nitriding ratio y compared with the curve A, but ON current is saturated and considerably lowered compared with the curve A. More specifically, if the nitriding ratio y is too large, the ON current would be lowered to a larger degree than the lowering of the OFF current, resulting in lowering of the contrast of the liquid crystal display device. Thus, as a result of studies by the inventors of the present invention, it was found that a desirable nitriding ratio of tantalum nitride is in the range of 0.05 to 0.14.

As described above, the substrate for the liquid crystal display device of the first embodiment has desirable electric characteristics. In the following, description is made of a substrate according to a second embodiment having more preferable characteristics and requiring less strict control of a flow rate of nitrogen gas in manufacturing.

Figure 7:
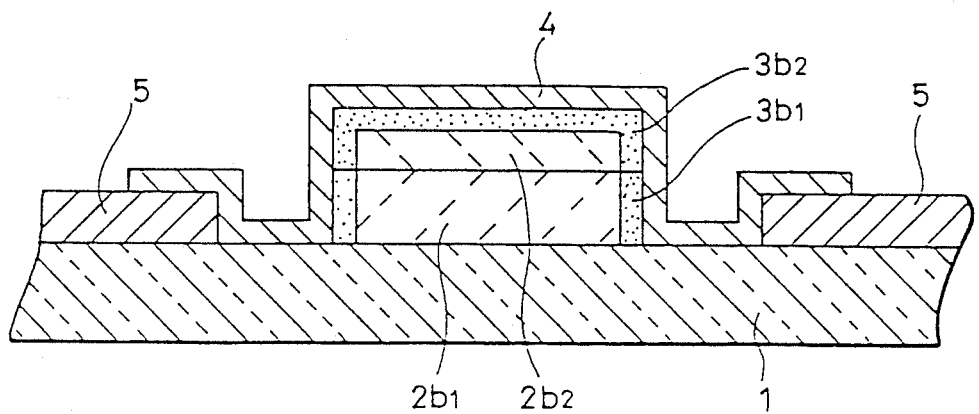
FIG. 7 is a sectional view of a part of a substrate for a liquid crystal display device according to a second embodiment of the present invention.

Referring to FIG. 7, a portion of the substrate for a liquid crystal display device according to the second embodiment is shown as a sectional view. The substrate of the second embodiment is similar to the substrate of the first embodiment, but the first metal layer of an MIM element includes first and second tantalum nitride layers $2b_1$ and $2b_2$. The first tantalum nitride layer $2b_1$ deposited on the insulator substrate 1 to a thickness of about 500 to 3000 Å has a nitriding ratio of about 0.05 to 0.2 and a low resistance value of $20\Omega/\square$ or less. The second tantalum nitride layer $2b_2$ deposited on the first tantalum nitride layer $2b_1$ to a thickness of about 500 to 3000 Å has a nitriding ratio of about 0.6 to 1.0 and a high resistance value of $20\phi/\square$ or more. Side walls of the first tantalum nitride layer $2b_1$ are covered with a first insulator layer $(TaO_xN_y)$ $3b_1$ and side walls and an upper surface of the second tantalum nitride layer $2b_2$ are covered with a second insulator layer $(TaO_xN_y)$ $3b_2$. Those insulator layers $3b_1$ and $3b_2$ have preferably thicknesses of 500 to 700 Å and they are covered with the second metal layer 4 of the MIM.

Figure 8:
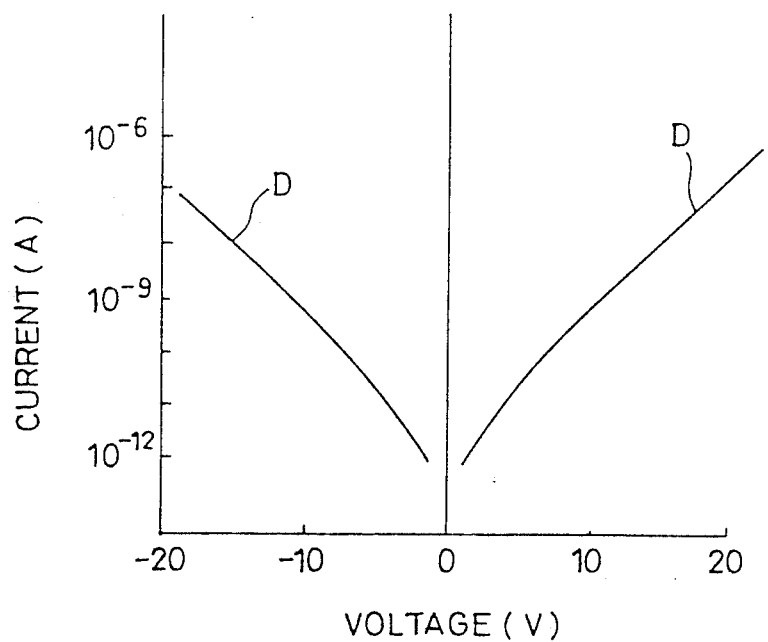
FIG. 8 is a graph showing electric characteristics of an MIM element in the second embodiment.

Referring to FIG. 8, curves D represent an example of electric characteristics of an MIM element in the second embodiment. According to the curves D, ON current of about $4 \times 10^{-8}$ A flows with respect to applied voltage of 18 V, and OFF current of about $5 \times 10^{-11}$ A flows with respect to applied voltage of 6 V. As is understood from comparison with the curves A in FIG. 6, according to the curves D, ON current is reduced by about 60%, and OFF current is reduced by a larger percentage, i.e., about 70%. Thus, the ratio of the OFF current to the ON current in the MIM element of the second embodiment is smaller than that in the MIM element of the first embodiment, which is more preferable for improvement of the contrast of the liquid crystal display device. In addition, since both the ON current and the OFF current are reduced, the operation margin of the liquid crystal display device is further improved. In order to obtain such desirable ON current and OFF current, the ratio of the area of the interface between the first insulator layer $3b_1$ and the first tantalum nitride layer $2b_1$ to the area of the interface between the second insulator layer $3b_2$ and the second tantalum nitride layer $2b_2$ should be in the range of 1/5 to 1/30.

In the above-described embodiment, the signal line $2a$ and the scanning line 7 are supplied with image signal voltage and scanning voltage, respectively. Conversely, the signal $2a$ and scanning line 7 may be supplied with scanning voltage and image signal voltage, respectively. This does not impose any limitation on the invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A substrate for a liquid crystal display device, comprising:
    an insulating substrate,
    a first conductor layer including a lower first sub layer and an upper second sub layer of tantalum nitride formed on a region of said insulating substrate and having different nitriding ratios,
    an insulator layer formed to cover at least a portion of said first conductor layer,
    a second conductor layer formed to cover at least a portion of said insulator layer, and
    a pixel electrode formed on another region of said insulating substrate and connected to said second conductor layer.

2. The substrate of claim 1, wherein said insulator layer includes a portion serving as an insulator layer in an MIM element, and in said MIM element, a ratio of an area of an interface between said insulator layer and said first sub layer to an area of an interface between said insulator layer and said second sub layer is in the range of from 1/5 to 1/30.

3. The substrate of claim 1, wherein said first sub layer has the nitriding ratio in the range of from 0.05 to 0.2, and said second sub layer has the nitriding ratio in the range of from 0.6 to 1.0.

4. The substrate of claim 3, wherein said insulator layer has a thickness in the range of from 500 Å to 700 Å.

5. The substrate of claim 1, wherein said substrate is used in a liquid crystal display device including a nematic liquid crystal.

6. The substrate of claim 1, wherein said liquid crystal is of the nematic type oriented in a state twisted by 90° between said substrate for the liquid crystal display device and another substrate.

7. A substrate for a liquid crystal display device, comprising:
    an insulating substrate,
    a first conductor layer of tantalum nitride formed on a region of said insulating substrate and having a nitriding ratio in the range of 0.05 to 0.14,
    an insulator layer formed to cover at least a portion of said first conductor layer,
    a second conductor layer formed to cover at least a portion of said insulator layer, and
    a pixel electrode formed on another region of said insulating substrate and connected to said second conductor layer.

8. The substrate of claim 7, wherein said insulator layer has a thickness in the range of from 480 Å to 800 Å.

9. The substrate of claim 7, wherein said substrate is used in a liquid crystal display device including a nematic liquid crystal.

10. The substrate of claim 7, wherein said liquid crystal is of the nematic type oriented in a state twisted by 90° between said substrate for the liquid crystal display device and another substrate.

11. The substrate of claim 7 wherein said first conductor layer includes a portion serving as a signal line, a portion serving as a first metal layer of an MIM element, and a portion serving as a terminal.

* * * * *